United States Patent
Toshitani et al.

(10) Patent No.: US 6,775,724 B2
(45) Date of Patent: Aug. 10, 2004

(54) METHOD AND APPARATUS FOR SYNCHRONIZATION CONTROL FOR VARIOUS FREQUENCIES

(75) Inventors: Masafumi Toshitani, Hamamatsu (JP); Hitoshi Koseki, Hamamatsu (JP)

(73) Assignee: Yamaha Corporation, Shizuoka-ken (JP)

(*) Notice: Subject to any disclaimer, the term of this patent is extended or adjusted under 35 U.S.C. 154(b) by 365 days.

(21) Appl. No.: 09/793,909

(22) Filed: Feb. 28, 2001

(65) Prior Publication Data

US 2001/0018730 A1 Aug. 30, 2001

(30) Foreign Application Priority Data

Feb. 28, 2000 (JP) ........................................ 2000-052063
Jul. 11, 2000 (JP) ........................................ 2000-210462

(51) Int. Cl.[7] .............................. G06F 3/00; G06F 3/06; H04L 29/00
(52) U.S. Cl. ........................... 710/60; 710/58; 375/372; 375/376; 709/233; 709/248
(58) Field of Search ................................ 709/100, 233, 709/248; 713/400; 711/111, 4; 710/58, 60; 375/376, 372; 370/516

(56) References Cited

U.S. PATENT DOCUMENTS

| | | | | |
|---|---|---|---|---|
| 4,961,188 A | * | 10/1990 | Lau | 370/517 |
| 5,359,727 A | * | 10/1994 | Kurita et al. | 713/400 |
| 5,572,169 A | * | 11/1996 | Iwamoto | 331/176 |
| 5,920,842 A | * | 7/1999 | Cooper et al. | 704/503 |
| 5,929,711 A | * | 7/1999 | Ito | 331/1 A |
| 6,104,326 A | * | 8/2000 | Lee et al. | 341/68 |
| 6,307,877 B1 | * | 10/2001 | Philips et al. | 375/130 |
| 6,347,380 B1 | * | 2/2002 | Chang et al. | 713/503 |
| 6,449,017 B1 | * | 9/2002 | Chen | 348/539 |

FOREIGN PATENT DOCUMENTS

| JP | 11274922 A | * | 10/1999 | ........... H03L/07/10 |
|---|---|---|---|---|
| JP | 2001136064 | * | 11/1999 | ......... H03K/021/02 |
| JP | 2001136064 A | * | 11/1999 | ......... H03K/021/02 |
| JP | 2001177394 A | * | 6/2001 | ........... H03L/07/08 |

* cited by examiner

Primary Examiner—Jeffrey Gaffin
Assistant Examiner—Angel Casiano
(74) Attorney, Agent, or Firm—Reed Smith LLP; Stanley P. Fisher Esq.; Juan Carlos A. Marquez, Esq.

(57) ABSTRACT

A synchronization control apparatus and method enables synchronization control which can flexibly accommodate various frequencies using a simple circuit construction. A storage device that has a predetermined capacity, such as a FIFO, stores externally input data. A CPU controls an output frequency at which data stored in the storage device are output, based on an average frequency which is an average of the output frequency and on a coefficient for setting the average frequency at a fixed value, the first frequency controlling device calculating the average of the output frequency whenever a timing signal is input in accordance with a predetermined cycle and determining the coefficient depending on a free capacity of the storage device at a time of inputting of the timing signal. The CPU operates if the calculated average frequency continuously exhibits a fixed value for a predetermined time period, to decrease the output frequency when the free capacity of the storage device is larger than a predetermined upper threshold value, while increasing the output frequency when the free capacity of the storage device is smaller than a predetermined lower threshold value. The upper threshold value and the lower threshold value each comprise two different values.

5 Claims, 12 Drawing Sheets

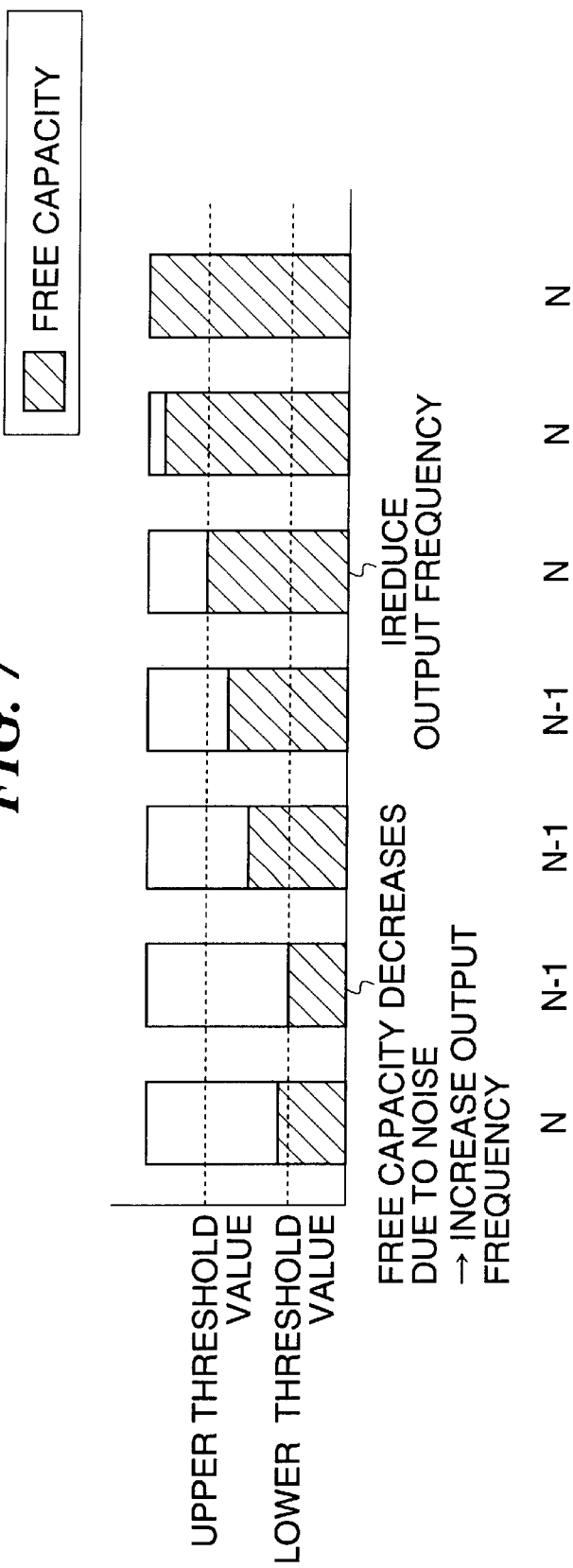

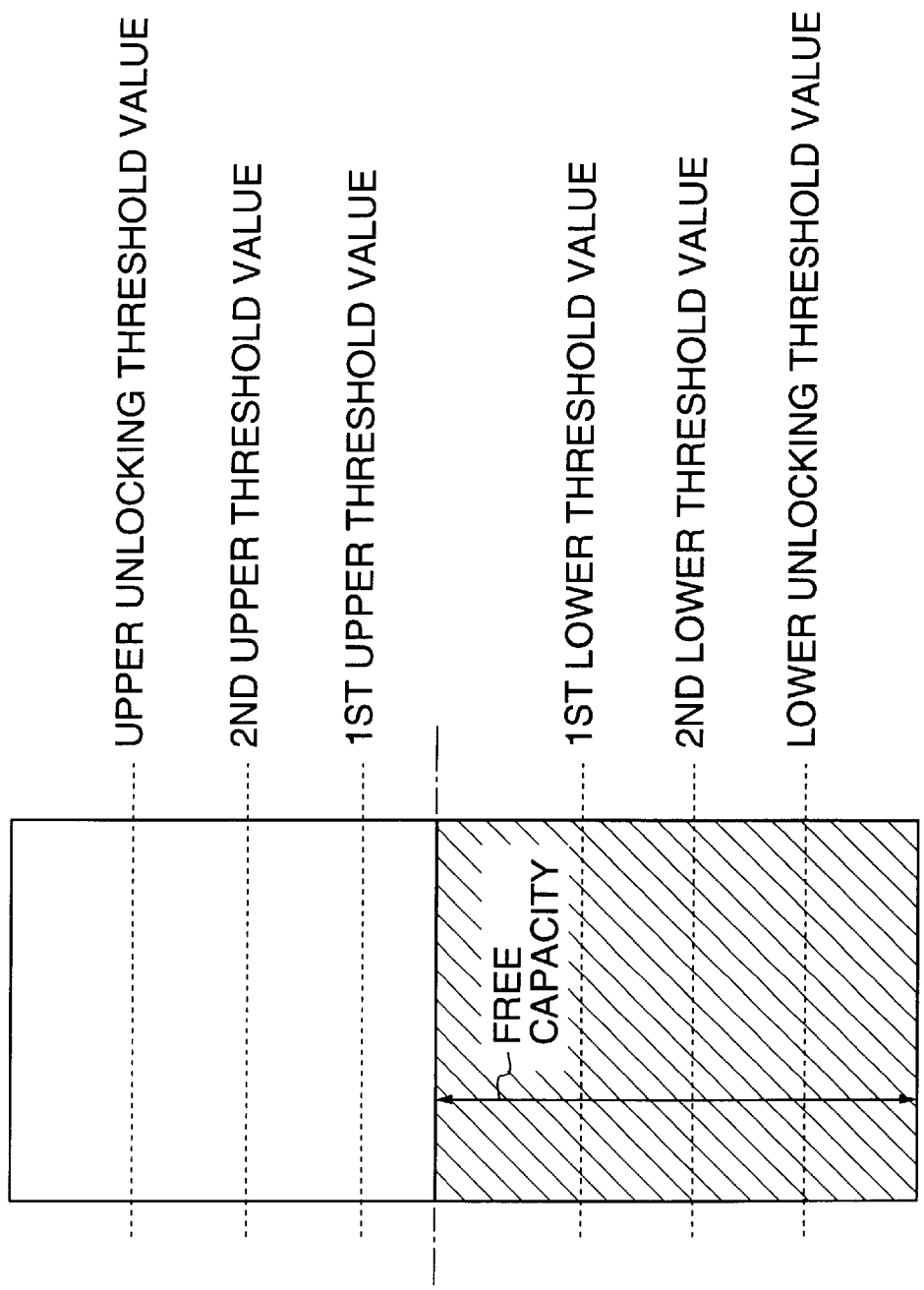

METHOD AND APPARATUS FOR SYNCHRONIZATION CONTROL FOR VARIOUS FREQUENCIES

"CROSS-REFERENCE TO RELATED APPLICATIONS

The present application claims the benefit of priority to Japanese Patent Application No. 2000-052063, filed on Feb. 28, 2000, and to Japanese Patent Application No. 2000-210462 filed on Jul. 11, 2000, that are incorporated herein by reference."

BACKGROUND OF THE INVENTION

1. Field of the Invention

The present invention relates to a synchronization control method and apparatus for generating output signals of frequencies synchronized with externally input data.

2. Prior Art

In recent years, systems have become popular, which transfer isochronous data such as voice or audio data from one apparatus to another for reproduction. For example, some of these systems transfer audio data from a personal computer to a simplified player for musical performance.

To reliably operate such apparatuses dealing with the transfer of isochronous data, the frequency of an input signal must be synchronized with the frequency of a corresponding output signal in a fixed manner. That is, if isochronous data are transferred between such apparatuses in an unlocked state where there is a difference in frequency phase between them, which increases with the lapse of time so that the data may be destroyed.

A PLL (Phase Locked Loop) is known as a method for generating an output signal of a frequency synchronized with a corresponding input signal. A general PLL circuit is essentially comprised of a phase comparator for comparing the phase of an input signal with the phase of a corresponding output signal, a loop filter for smoothing an output from the comparator, and a VCO (voltage controlled oscillator) for outputting a reproduction clock having a frequency varied by an output from the filter.

Further, if a 44.1 kHz sampling clock synchronized with a 1 kHz input signal is to be generated from this input signal, a frequency dividing circuit must be provided in a feedback circuit to the phase comparator, to reduce the reproduction clock frequency of 44.1 kHz to 1 kHz.

If, however, all elements required for such a circuit are constructed of hardware, the number of elements disadvantageously increases in proportion to the number of frequency dividing stages, resulting in a complicated circuit construction. Further, if the PLL is constructed of hardware, the ratio of an input frequency to an output frequency is disadvantageously fixed, whereby input and output signals having various different frequency ratios cannot be flexibly processed.

SUMMARY OF THE INVENTION

It is an object of the present invention to provide a synchronization control apparatus and method that enables synchronization control which can flexibly accommodate various frequencies using a simple circuit construction.

To attain the above object, the present invention provides a synchronization control apparatus comprising a storage device that has a predetermined capacity for storing externally input data, a first frequency controlling device that controls an output frequency at which data stored in the storage device are output, based on an average frequency which is an average of the output frequency and on a coefficient for setting the average frequency at a fixed value, the first frequency controlling device calculating the average of the output frequency whenever a timing signal is input in accordance with a predetermined cycle and determining the coefficient depending on a free capacity of the storage device at a time of inputting of the timing signal, and a second frequency control device that operates if the calculated average frequency continuously exhibits a fixed value for a predetermined time period, to decrease the output frequency when the free capacity of the storage device is larger than a predetermined upper threshold value, while increasing the output frequency when the free capacity of the storage device is smaller than a predetermined lower threshold value, wherein the upper threshold value and the lower threshold value each comprise two different values.

Preferably, the synchronization control apparatus according to the present invention comprises a signal generating device that generates a signal of a predetermined frequency, and a frequency dividing device that divides the predetermined frequency using a frequency dividing value, and wherein the first frequency controlling device and the second frequency controlling device change the frequency dividing value of the frequency dividing device to control the output frequency.

More preferably, the second frequency controlling device decreases the output frequency by adding a predetermined value to the frequency dividing value, and increases the output frequency by subtracting the predetermined value from the frequency dividing value.

Preferably, the second frequency controlling device increases or decreases the output frequency a number of times equal to or smaller than a predetermined limit number based on the upper threshold value and the lower threshold value.

To attain the above object, the present invention further provides a synchronization control method comprising a storage step of storing externally input data in a a storage device that has a predetermined capacity, a first frequency controlling step of controlling an output frequency at which data stored in the storage device are output, by calculating, based on an average frequency which is an average of the output frequency and on a coefficient for setting the average frequency at a fixed value, the average of the output frequency whenever a timing signal is input in accordance with a predetermined cycle, and determining the coefficient depending on a free capacity of the storage device at a time of inputting of the timing signal, and a second frequency control step of decreasing, if the calculated average frequency continuously exhibits a fixed value for a predetermined period, the output frequency when the free capacity of the storage device is larger than a predetermined upper threshold value, while increasing the output frequency when the free capacity of the storage device is smaller than a predetermined lower threshold value, wherein the upper threshold value and lower threshold value each comprise two different values.

The above and other objects of the invention will become more apparent from the following detailed description taken in conjunction with the accompanying drawings.

BRIEF DESCRIPTION OF THE DRAWINGS

FIG. 7 is a view showing an example of a lock in an unstable state;

FIG. 8 is a view useful in explaining how a threshold value is set for the free capacity of the FIFO;

DETAILED DESCRIPTION OF PREFERRED EMBODIMENTS

The present invention will be described in detail below with reference to the drawings showing a preferred embodiment thereof.

Figure 1:
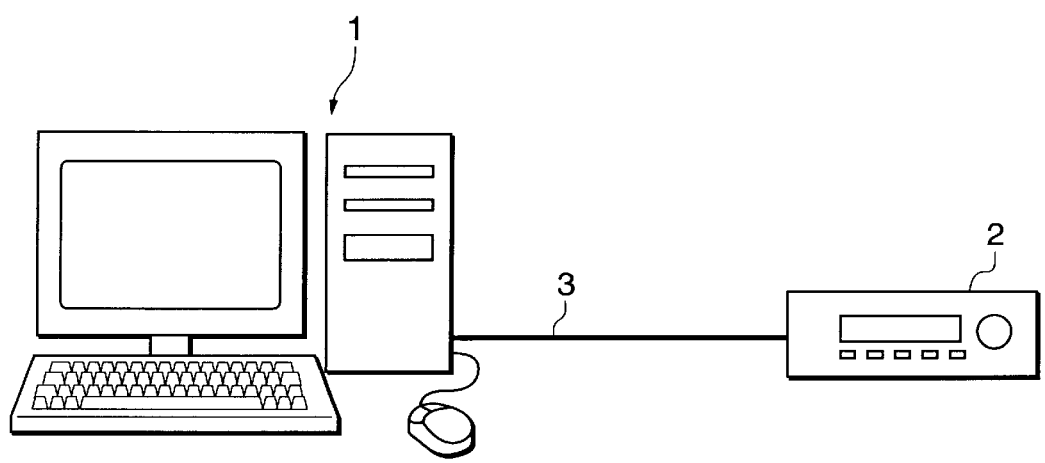
FIG. 1 is a view showing the entire construction of an audio system incorporating a synchronization control apparatus according to an embodiment of the present invention.

FIG. 1 is a view showing the entire construction of an audio system incorporating a synchronization control apparatus according to an embodiment of the present invention. The audio system according to the present embodiment is comprised of a computer 1, a player 2, and a cable 3 for connecting them together.

The computer 1 serves as an apparatus for transmitting audio data taken at a predetermined sampling clock of, for example, 32 kHz, 44.1 kHz, or 48 kHz to the player 2 via the cable 3, and the player 2 serves as an apparatus for reproducing and outputting the transmitted audio data.

In the present embodiment, the cable 3 is of a USB (Universal Serial Bus) type, and the computer 1 acts as a host for transferring audio data, while the player 2 acts as a device for sinking the audio data.

For the USB, three types of synchronization (asynchronous, synchronous, and adapted) are defined, but the present embodiment uses the adapted synchronization type for synchronization control for reasons described below.

First, with the asynchronous type, the player 2 does not synchronize with the computer 1, so that they operate at different clocks and the player 2 feeds back a data rate.

With this synchronization type, the computer 1 undergoes a large processing burden, and data may be destroyed if a plurality of players 2 are connected to the computer 1 to form a multidevice system.

Further, the synchronization type synchronizes the computer 1 and the player 2 with an SOF (Start Of Frame) according to the USB, with the player 2 locked to the SOF. On the other hand, the adapted type synchronizes the computer 1 with the player 2 using data rate information, with the player 2 locked to a data flow.

The SOF is a signal for identifying the start of a frame and constitutes a first transaction of each frame. For the USB, a cycle of 1.0 ms (a frequency of 1 kHz) is defined as a bus clock, and the host outputs the SOF every 1.0 ms and outputs a data packet to be transferred for the frame, following the SOF.

Figure 2A:
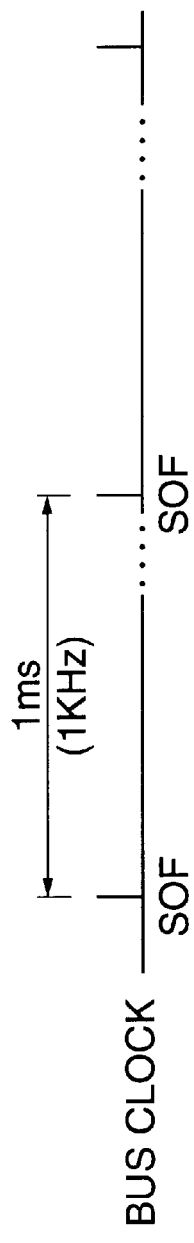
FIGS. 2A to 2C are views useful in explaining a USB frame.
Figure 2B:
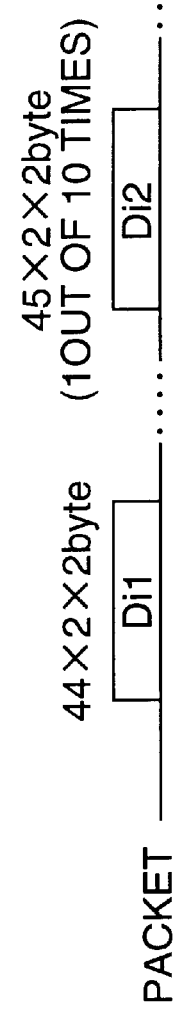
Figure 2C:
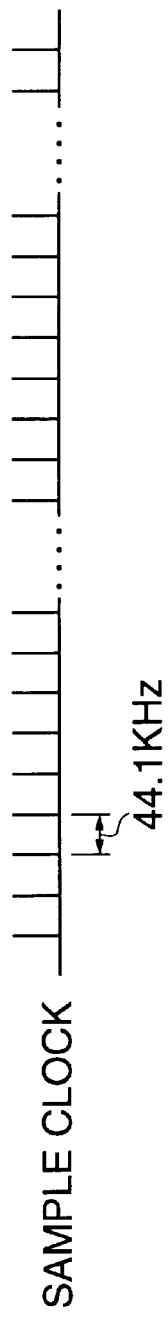

FIGS. 2A to 2C are views useful in explaining the USB frame. FIG. 2A shows the cycle of a bus clock, FIG. 2B shows transferred packets, and FIG. 2C shows a sample clock for transferred data.

As described above, the bus clock for the USB has a frequency of 1 kHz, and one cycle thereof constitutes one frame. Thus, the SOF, indicating the start of the frame, is output from the computer 1 every 1 ms, as shown in FIG. 2A.

In the example shown in FIGS. 2A to 2C, 16-bit (2-byte) stereo audio data taken at a sampling clock of 44.1 kHz are transferred from the computer 1 to the player 2 and output from the computer as a packet in the form of a burst signal, following the SOF.

The amount of data transferred in each packet is 44×2×2 bytes for 9 out of 10 frames and is 45×2×2 bytes for the remaining one frame. Thus, a data flow for 10 frames provides 441×2×2 bytes every 10 ms, resulting in a general data rate of 44.1 kHz.

On the other hand, with the synchronous type, the player 2 must hold a clock synchronized with the SOF and must operate so that the data rate is automatically locked to the SOF. That is, in the example shown in FIGS. 2A to 2C, the player 2 must lock the reproduction clock to a data rate of 44.1 kHz. Realizing this lock with the PLL requires a circuit for dividing the frequency of the reproduction clock into pieces of 1 kHz each, which corresponds to the frequency of the SOF, thereby making the system unstable.

Further, the data may be destroyed if the data flow to the player 2 is not completely locked to the SOF or if the frequency of the data flow varies.

Therefore, in the present embodiment, the player 2 is constructed so as to achieve synchronization control for locking to the data flow by using the adapted type, which locks the player 2 to the data flow, and monitoring the data flow through execution of a program. A synchronization control section of the player 2 which can execute such synchronization control will be described in detail below.

Figure 3:
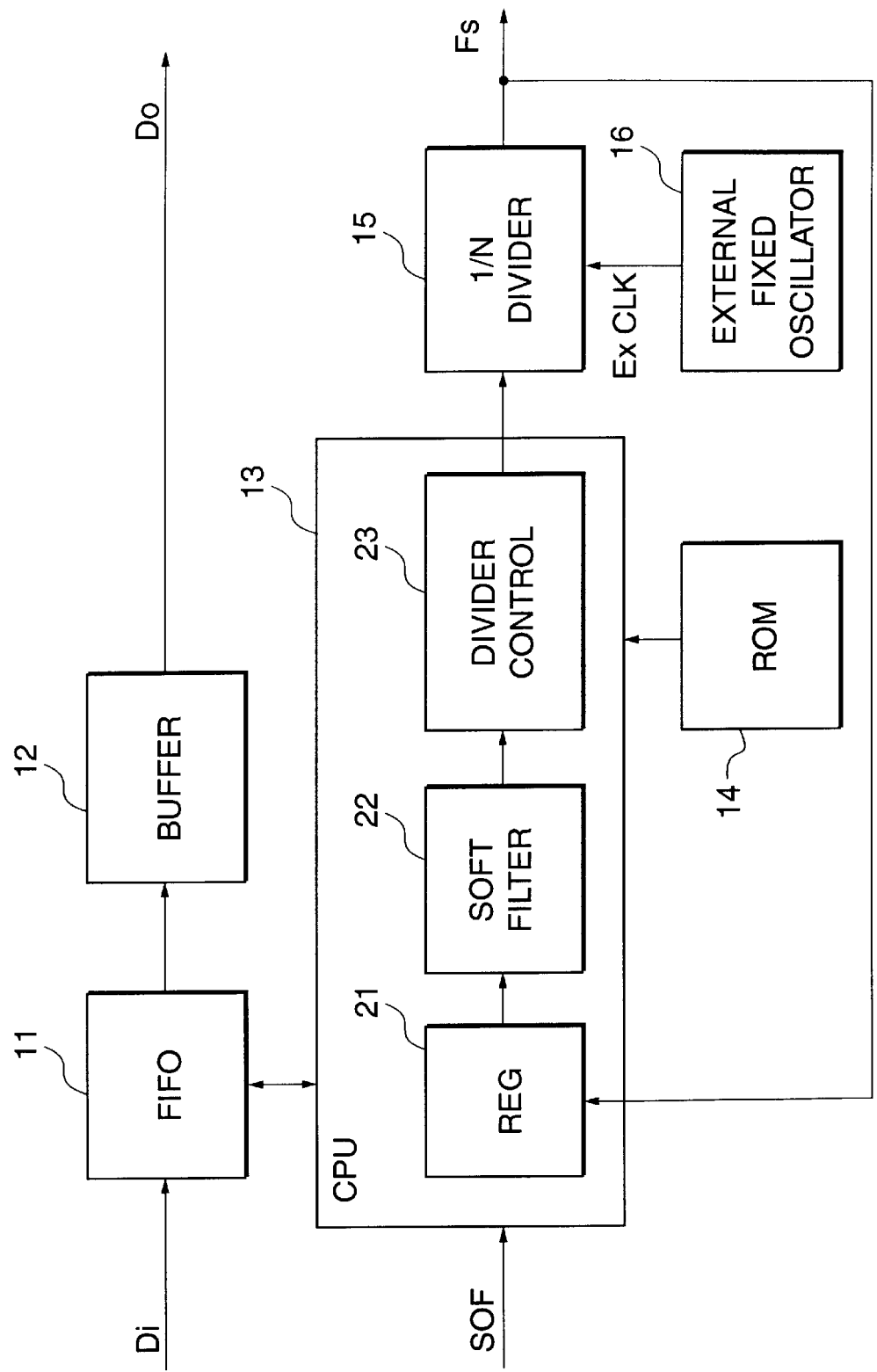
FIG. 3 is a block diagram showing the construction of a synchronization control section.

FIG. 3 is a block diagram showing the construction of the synchronization control section provided in the player 2. As shown in this figure, the synchronization control section is comprised of a FIFO (First In First Out) 11 and a buffer 12 which store externally input audio data, a CPU 13 for controlling various sections, a ROM 14 that stores control programs, a 1/N divider 15 for dividing the frequency of an external clock ExCLK under the control of the CPU 13, and an external fixed oscillator 16 for generating the external clock ExCLK.

The FIFO 11 stores digital audio data Di (the above described packets) transmitted from the computer 1 and outputs them in a first in first out manner. The output data are stored in the buffer 12 and supplied to a D/A converter, not shown, as output data Do, where the digital audio data are converted into an analog audio signal.

In the present embodiment, a data flow of the output data Do follows an output sampling signal Fs. More specifically, the audio data are supplied to the above-mentioned D/A converter and converted into the audio analog signal, in accordance with the cycle of the output sampling signal Fs.

That is, the frequency of the output sampling signal Fs indicates the data rate for the player 2.

The output sampling signal Fs is generated by the 1/N divider 15 by dividing the frequency of the external clock ExCLK into N pieces, the external clock having a fixed frequency and being generated by the external fixed oscillator 16. The divider value N (N is a positive integral) required as a frequency dividing value is determined under the control of the CPU 13. In this connection, the above-mentioned SOF is supplied to the CPU 13 as shown in FIG. 3, and the CPU 13 determines the divider value N in timing in which the SOF is input, as described in detail later.

Further, the CPU 13 controls data write and read addresses for the FIFO 11 and determines the divider value based on a free capacity of the FIFO 11 which can be used to store data therein.

More specifically, the CPU 13 operates in accordance with the programs stored in the ROM 14 to function as a construction comprised of a group of registers 21, a soft filtering section 22, and a divider control section 23 to control the FIFO 11 and the 1/N divider 15.

The group of registers 21 store various monitor values such as data write and read addresses for the FIFO 11 and the divider value N. The above-mentioned output sampling signal Fs is supplied to the group of registers 21 so that the read address for the FIFO 11 is renewed based on the output sampling value Fs.

The soft filtering section 22 calculates a running average of the divider values in the 1/N divider 15, so that the divider control section 23 calculates a new divider value N based on the calculated running average to control the 1/N divider, as described in detail later.

In the present embodiment, control described below is achieved using software to thereby execute synchronization control that flexibly accommodates various frequencies using a simply constructed circuit such as the one shown in FIG. 3. Furthermore, control is provided such that the output data Do are output at a more stable frequency while synchronized with the corresponding input signal.

Next, the operation of the present embodiment constructed as described above will be described.

First, an outline of the synchronization control section shown in FIG. 3 will be explained with reference to FIGS. 4 to 8.

As described previously, the CPU 13 renews the read address for the FIFO 11 based on the output sampling signal Fs. Since the output sampling signal Fs is a clock signal obtained by dividing the frequency of the external clock ExCLK in accordance with the divider value N, it is understood that the following relationship exists between the divider value N and the data flow:

As the divider value N increases, the magnitudes of the output sampling signal Fs and accordingly the data flow decreases. On the contrary, the data flow of the audio data Di transferred from the computer 1 is stable as shown in FIGS. 2A to 2C, so that as the divider value N increases, the amount of data remaining in the FIFO 11 also increases, thus reducing the free capacity of the FIFO 11.

On the other hand, as the divider value N decreases, the frequency of the output sampling signal Fs and accordingly the data flow increases, thereby increasing the free capacity of the FIFO 11. In the present embodiment, the player 2 is locked to the data flow by providing control based on the above described relationship between the divider value and the free capacity of the FIFO 11.

Figure 4:
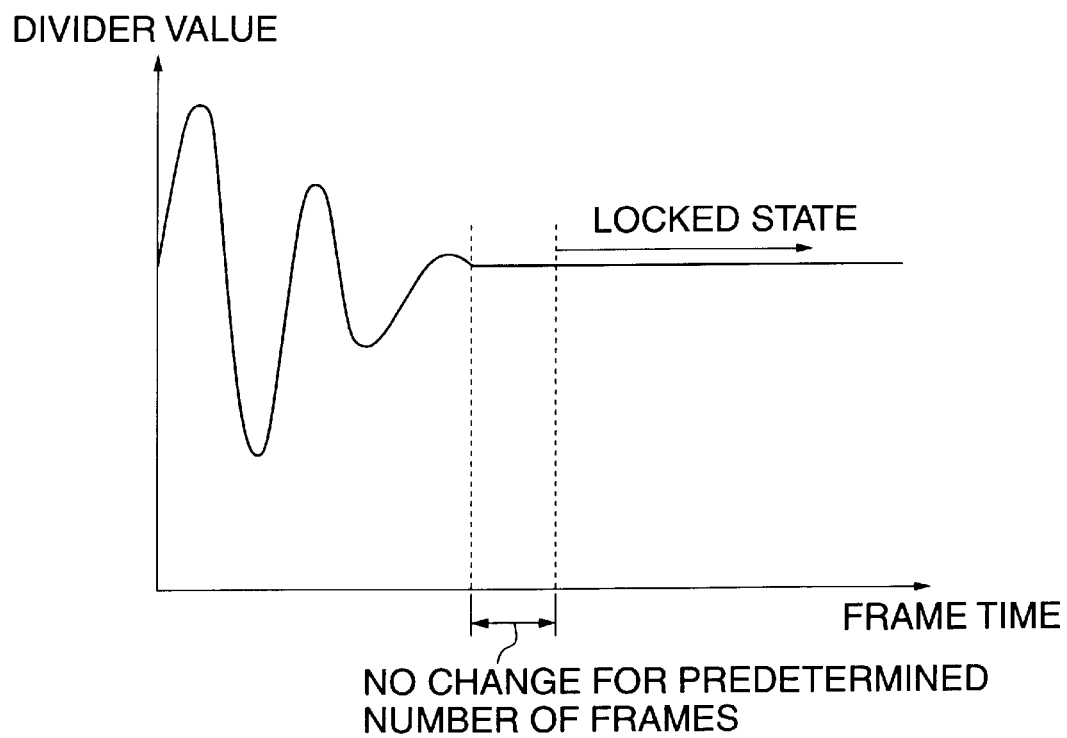
FIG. 4 is a graph illustrating how a divider value changes.
Figure 5:
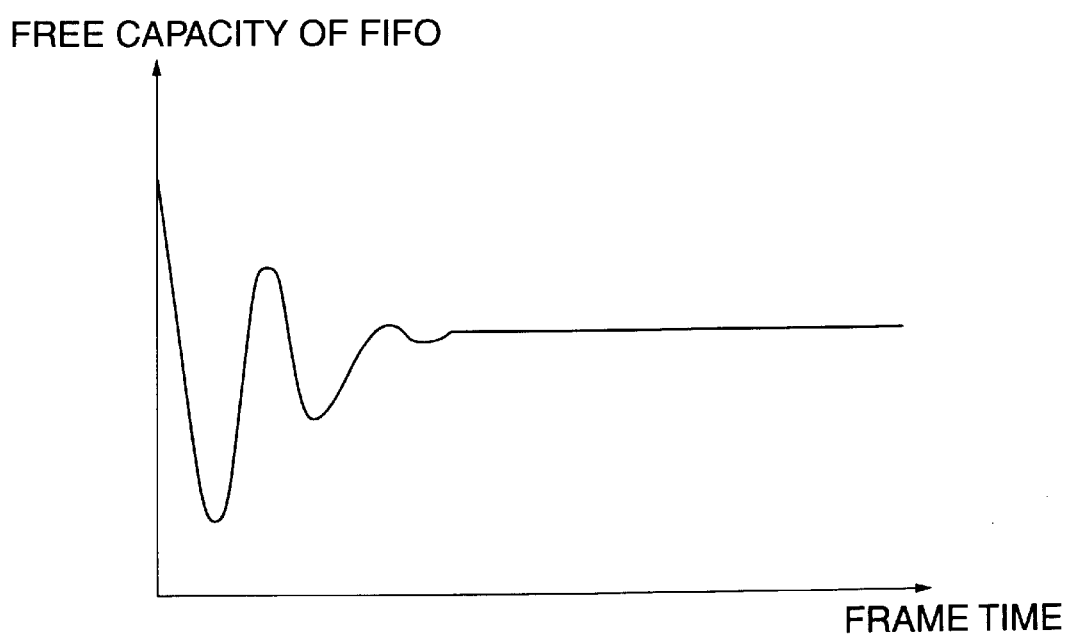
FIG. 5 is a graph illustrating how the free capacity of a FIFO changes.

The graph in FIG. 4 shows an example of temporal changes in the divider value N, and the graph in FIG. 5 shows an example of temporal changes in the free capacity of the FIFO 11, which correspond to the changes in the divider value N shown in FIG. 4. As described above, the SOF, which is indicative of the start of each frame corresponding to 1 ms, is transmitted from the computer 1, and whenever the computer 13 receives the SOF, it determines the divider value N and detects the free capacity of the FIFO 11. The graph shown in FIG. 4 shows a frame time in milliseconds on the abscissa and shows the divider value N determined for each frame time, on the ordinate. Likewise, the graph shown in FIG. 5 shows the frame time in milliseconds on the abscissa and shows the divider value N determined for each frame time, on the ordinate.

Due to the above-mentioned relationship between the divider value N and the free capacity of the FIFO 11, the free capacity of the FIFO 11 decreases as the divider value N increases, whereas the free capacity of the FIFO 11 increases as the divider value N decreases, as shown in FIGS. 4 and 5.

The reason why the alternately increasing and decreasing free capacity of the FIFO 11 converges as shown in FIG. 5 is that the divider control section 23 shown in FIG. 3 determines the divider value N in such a manner as to increase the same if a large free capacity is detected in the FIFO 11, while reducing the same if a small free capacity is detected in the FIFO 11. This determining method will be described in detail later.

In the present embodiment, the divider value N is assumed to be locked if the running average of the divider value N calculated by the soft filtering section 22 has not varied for a time period corresponding to a predetermined number of frames.

In this connection, the frequency of the output sampling signal Fs generated after the divider value N has not varied for the period corresponding to the predetermined number of frames (locked state) does not necessarily equal the sampling rate of audio data transferred through the USB. If, for example, the external clock ExCLK generated by the external fixed oscillator 16 has a frequency of 48 MHz and the sampling rate is 44.1 kHz as shown in FIG. 2C, then 48 (MHz)÷44.1 (kHz)=1088.435 . . . , and the divider value N, a positive integral, is thus likely to be locked near 1088.

If the divider value N is locked at 1088, the frequency of the output sampling signal Fs is higher than 44.1 kHz (48 MHz/1088≒44.12 kHz). If, however, the divider value N is locked at 1089, the frequency of the output sampling signal Fs is lower than 44.1 kHz (48 MHz/1089≒44.07 kHz).

The free capacity of the FIFO 11 increases with the lapse of time if the frequency of the output sampling signal Fs is higher than the USB sampling rate, while the free capacity of the FIFO 11 decreases with the lapse of time if the frequency of the output sampling signal Fs is lower than the USB sampling rate, as described previously.

When the divider value N is thus sequentially controlled in response to an increase or decrease in the free capacity of the FIFO 11, the frequency of the output sampling signal Fs is frequently changed, thereby distorting the reproduction signal to degrade audio characteristics.

Therefore, in the present embodiment, after the divider value N has been locked, the CPU 13 controls the 1/N divider 15 so as not to change the divider value N until the free capacity of the FIFO 11 exceeds a permissible range. The permissible range may be set to one below which data may overflow due to too small a free capacity and above which the data may underflow due to too large a free capacity.

Figure 6A:
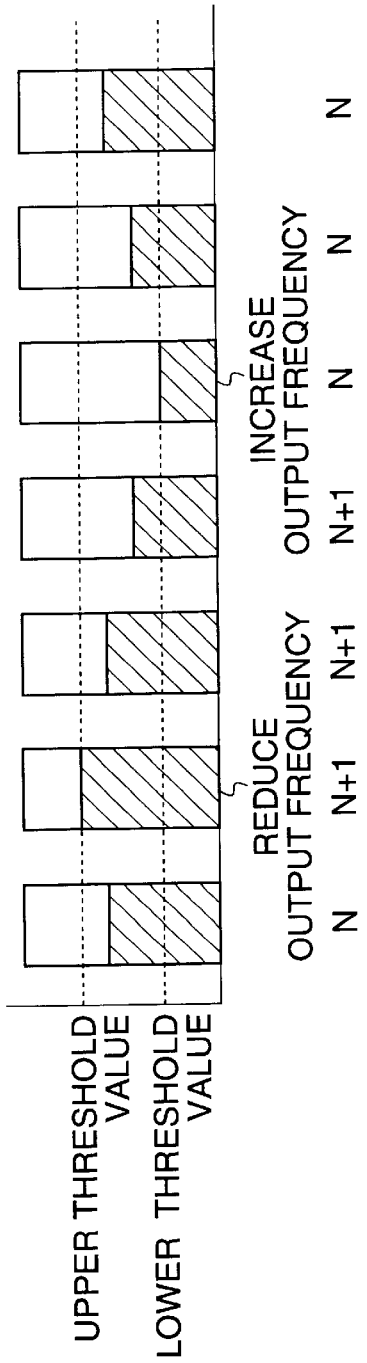
FIGS. 6A and 6B are views showing the relationship between the free capacity of a FIFO appearing in FIG. 3 and an output frequency.

This control will be described in further detail with reference to FIGS. 6A and 6B. FIG. 6A shows a case where the frequency of the sampling signal Fs is higher than the USB sampling rate in a locked state, and FIG. 6B shows a case where the frequency of the sampling signal Fs is lower than the USB sampling rate in the locked state.

In either case, it is assumed that an upper threshold value and a lower threshold value are set as defining the permissible range of the free capacity of the FIFO 11 and that the free capacity in the locked state falls within this permissible range.

If the frequency of the sampling signal Fs is higher than the USB sampling rate as shown in FIG. 6A, then the free capacity of the FIFO 11 increases with the lapse of time unless the divider value N is changed from the one in the located state. If the divider value N then remains unchanged in such a state, the free capacity of the FIFO 11 reaches its upper threshold value. At this point of time, if the divider value N is increased (for example, to N+1) so as to reduce the frequency of the output sampling signal Fs, then the free capacity of the FIFO 11 decreases with the lapse of time. If the changed divider value N+1 remains unchanged, then the free capacity of the FIFO 11 reaches its lower threshold value. At this point of time, if the divider value N is reduced (for example, to N+1−1=N) so as to increase the frequency of the output sampling signal Fs, then the free capacity of the FIFO 11 again increases with the lapse of time.

Figure 6B:
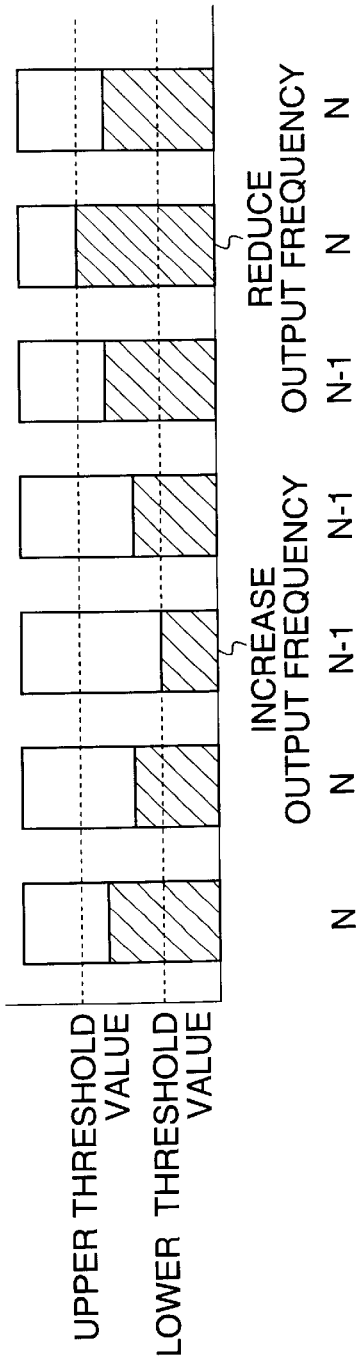

Further, if the frequency of the sampling signal Fs is lower than the USB sampling rate as shown in FIG. 6B, then the free capacity of the FIFO 11 decreases with the lapse of time unless the divider value N is changed from the one in the located state. If the divider value N then remains unchanged in such a state, the free capacity of the FIFO 11 reaches its lower threshold value. At this point of time, if the divider value N is reduced (for example, to N−1) so as to increase the frequency of the output sampling signal Fs, then the free capacity of the FIFO 11 increases with the lapse of time. If the changed divider value N−1 remains unchanged, then the free capacity of the FIFO 11 reaches its upper threshold value. At this point of time, if the divider value N is increased (for example, to N−1+1=N) so as to reduce the frequency of the output sampling signal Fs, then the free capacity of the FIFO 11 again decreases with the lapse of time.

When the upper and lower threshold values are thus set and a predetermined value is added to the divider value N when the free capacity of the FIFO 11 reaches the upper threshold value, while the predetermined value is subtracted from the divider value N when the free capacity of the FIFO 11 reaches the lower threshold value, the variation of the divider value N can be converged to a predetermined value and the divider value N must be less frequently changed, thereby preventing degradation of the audio characteristics.

Moreover, when the divider value N is locked when the free capacity of the FIFO 11 is close to the upper or lower threshold value, a problem may occur as follows:

In the example shown in FIG. 7, the locked state occurs when the free capacity of the FIFO 11 is close to the lower threshold value. Such a state is likely to occur if the frequency of the output sampling signal Fs is the same as or very close to the USB sampling rate. This is because the external clock ExCLK generated by the external fixed oscillator 16 has a frequency of 48 MHz and the USB sampling rate is 44.1 kHz as described above, then since 48 MHz is indivisible by 44.1 kHz, the free capacity of the FIFO 11 becomes stable before the running average of the divider value N is stabilized. If, however, the USB sampling rate is 32 kHz, the divider value N may become stable at a value thereof obtained by the dividing 48 MHz by 32 kHz before the free capacity of the FIFO 11 is stabilized.

In the case shown in FIG. 7, when the free capacity of the FIFO 11 decreases to reach its lower threshold value due to fluctuation or noise, the predetermined value (=1) is subtracted from the divider value N to change the same to N−1 so as to increase the frequency of the output sampling signal Fs. Accordingly, the free capacity of the FIFO 11 increases with the lapse of time and reaches its upper threshold value. At this point of time, the predetermined value (=1) is added to the divider value N to change the same to N−1+1 so as to reduce the frequency of the output sampling signal Fs.

Here, the frequency of the output sampling signal Fs returns to the value in the locked state, but the free capacity of the FIFO 11 may further increase to cause underflow. This is because if the frequency of the output sampling frequency Fs cannot be matched with the USB sampling rate but is lower than the same as shown in FIG. 6B, as in the case where the USB sampling rate is 44.1 kHz, then the free capacity decreases once the frequency of the output sampling signal Fs returns to the value in the locked state. If, however, the frequency of the signal Fs can be matched with the USB sampling rate as in the case where the USB sampling rate is 32 kHz, the free capacity does not necessarily decrease even when the frequency of the output sampling signal Fs returns to the value in the locked state.

Therefore, in the present embodiment, two-level upper threshold values and two-level lower threshold values are set (a first upper threshold value, a second upper threshold value, a first lower threshold value, and a second lower threshold value) as shown in FIG. 8 so that even if the free capacity cannot be properly increased or reduced by changing the frequency using the first threshold value, then the frequency can be further changed using the second threshold value.

Control provided by the CPU 13 if the two-level thresholds are set as described above will be described in detail later with reference to the flow charts.

The above-mentioned two-level upper and lower threshold values are used to control the divider value N after the latter has been locked, but unlocking threshold values shown in FIG. 8 are used to clear the locked state so as to provide lock control again if the free capacity of the FIFO 11 exceeds these threshold values.

A process executed by the CPU 13 to provide the above described synchronization control will be explained with reference to the flow charts.

Figure 9:
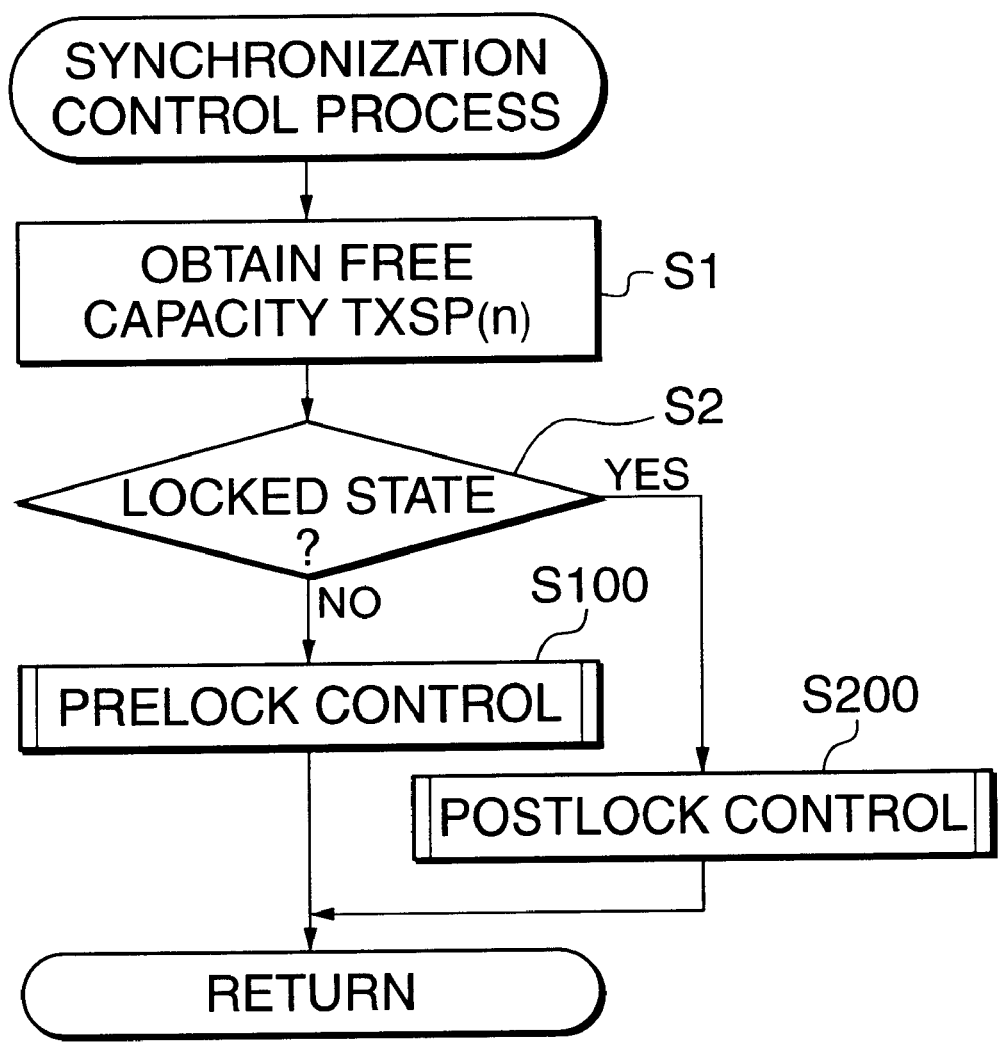
FIG. 9 is a flow chart showing the operation of the present embodiment.

FIG. 9 is a flow chart showing the operation of the synchronization control process. As described above, this process is executed as an interruption process when the CPU 13 detects the SOF indicative of the start of a frame.

When the synchronization control process is started, the CPU 13 obtains the value of the free capacity of the FIFO 11 and sets the same to a variable TXSP(n) (step S1). The character "n" denotes the number of a frame at the time of execution of the interruption process, and is indicative of elapsed time in milliseconds because the interruption process shown in FIG. 9 is executed each time the CPU 13 detects the SOF. After obtaining the free capacity TXSP(n) of the FIFO 10, the CPU 13 determines whether or not the locked state exists (step S2). In this connection, in the present embodiment, a "lock flag" is provided, which indicates whether or not the locked state exists, so that the determination at the step S2 can be made based on whether or not this flag is set.

If it is determined at the step S2 that the locked state does not exist, "prelock control" is provided to converge the frequency of the output sampling frequency Fs to bring the divider value N into the locked state (step S100). If it is determined at the step S2 that the locked state exists, "postlock control" is provided to maintain the frequency of the output sampling frequency Fs within a predetermined range (step S200), thereby completing the synchronization control process, which is the interruption process.

First, the prelock control (step S100 in FIG. 9) will be described in further detail with reference to FIG. 10.

Once the prelock control is started, the CPU 13 calculates the running average Nav(n) of the divider value N at the time of execution of the process (step S101). In the present embodiment, the running average of the divider value N is determined as an additive average according to the following equation:

$$Nav(n)=Nav(n-1)+(N(n-1)-Nav(n-1))/F$$

where Nav(n−1) denotes the running average of the divider value N calculated by the last executed prelock control and N(n−1) denotes the divider value N calculated based on the running average Nav(n−1). Further, the character F denotes a filter coefficient which is a time constant of the soft filtering section 22.

As shown in the above equation, the running average Nav(n) of the present calculated divider value V is obtained by subtracting the last calculated running average Nav(n−1) from the last divider value N(n−1), dividing the obtained value by the filter coefficient F, and adding the quotient to the last calculated running average Nav(n−1).

Then, the thus determined present running average Nav (n) is compared with the last running average Nav(n−1) to determine whether or not Nav(n)=Nav(n−1), that is, whether or not the running average has changed (step S102). If it is determined that the running average has changed (the answer to the step S102 is No), a variable LOCKCOUNT is initialized (LOCKCOUNT=60) to clear the lock flag (step S103). In this case, the variable LOCKCOUNT is for counting the period of time required for a predetermined number of frames as described previously with reference to FIG. 4. In the present embodiment, if the period of time required for 60 frames has elapsed without changing the running average, it is determined that the locked state has occurred. Further, the lock flag indicates whether or not the locked state exists and is set when the locked state occurs.

Accordingly, if it is determined at the step S102 that the running average has not changed (the answer to the step S102 is Yes), the variable LOCKCOUNT is decremented by 1 (LOCKCOUNT−1). If it is determined that this value has become zero, that is, the running average remains unchanged for a time period corresponding to 60 frames (the answer to the step S104 is Yes), the lock flag is set. In this case, the variable LOCKCOUNT is also initialized (step S105).

The lock state is prevented from occurring as in the case where the lock flag is cleared (step S103) as described above or it is determined at the step S104 that the lock count has not become zero (the answer to the step S104 is No), or the lock state is allowed to occur as in the case where lock flag is set (step S105), and then a coefficient Ftb (TXSP(n)) corresponding to the previously obtained free capacity TXSP(n) of the FIFO 11 is obtained from a table (step S106). Then, the following equation is executed to calculate the present divider value N (n), which is then set as the divider value N for the divider 15 (step S107) to complete the prelock control.

$$N(n)=Nav(n)+Ftb(TXSP(n))$$

Figure 11:
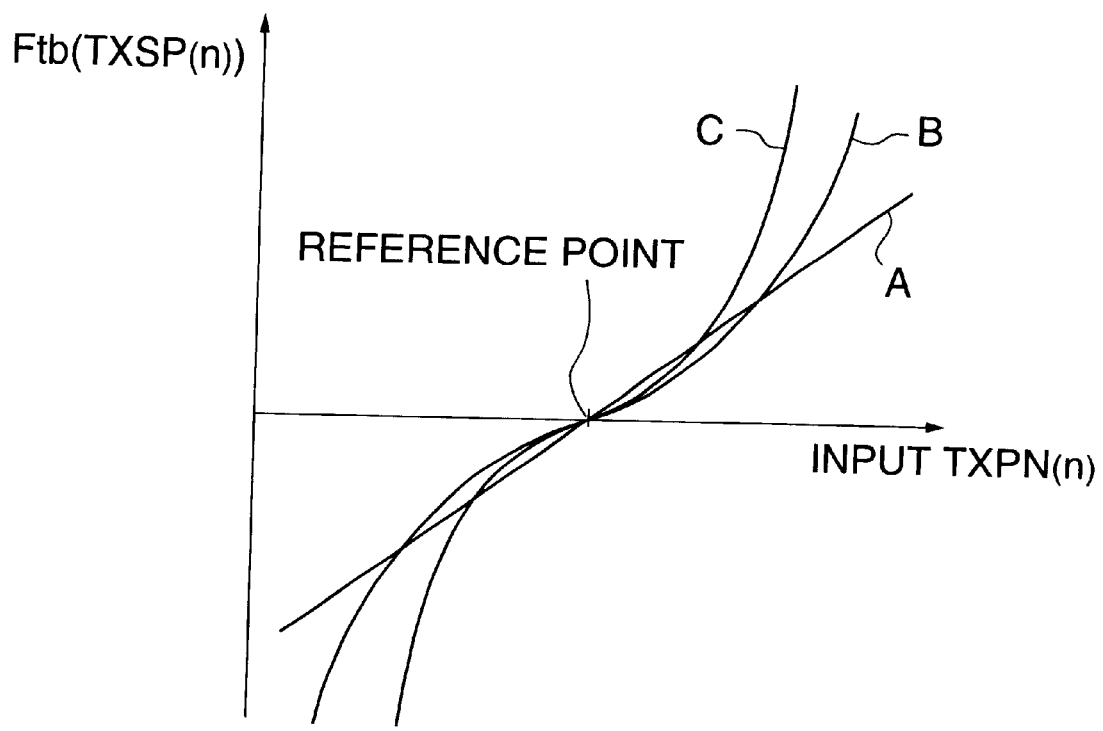
FIG. 11 is a graph showing examples of a table for determining a divider value N which is set based on the free capacity of the FIFO 11 in FIG. 3.

The table is used to determine the divider value N to be set based on the free capacity of the FIFO 11 at the time of execution of the process; several examples of the table are shown in FIG. 11. In each of table examples A, B, and C shown in FIG. 11 and having different curves, the coefficient Ftb (TXSP(n)), which is output using the free capacity TXSP(n) as an input value, increases with an increase in the free capacity TXSP(n)and decreases with a decrease in the same.

As described previously, as the divider value N increases, the frequency of the output sampling signal Fs and thus the free capacity of the FIFO 11 decrease, and as the divider value N decreases, the frequency of the output sampling signal Fs and thus the free capacity of the FIFO 11 increase. Accordingly, the present calculated divider value N(n) is determined by adding to the running average Nav(n), the coefficient Ftb (TXSP(n)) determined based on the free capacity TXSP(n) of the FIFO 11.

As a result, if the FIFO 11 has a large free capacity, a divider value N(n) is calculated, which is obtained by the addition of the coefficient Ftb (TXSP(n)) for reducing the free capacity, whereas if the FIFO 11 has a small free capacity, a divider value N(n) is calculated, which is obtained by the addition of the coefficient Ftb (TXSP(n)) for increasing the free capacity, so that the free capacity converges gradually to a reference point. Once the free capacity has converged, the coefficient Ftb (TXSP(n)) becomes equal between the frames, and the running average remains unchanged for a time period corresponding to 60 frames, so that the divider value N is brought into the locked state.

Figure 10:
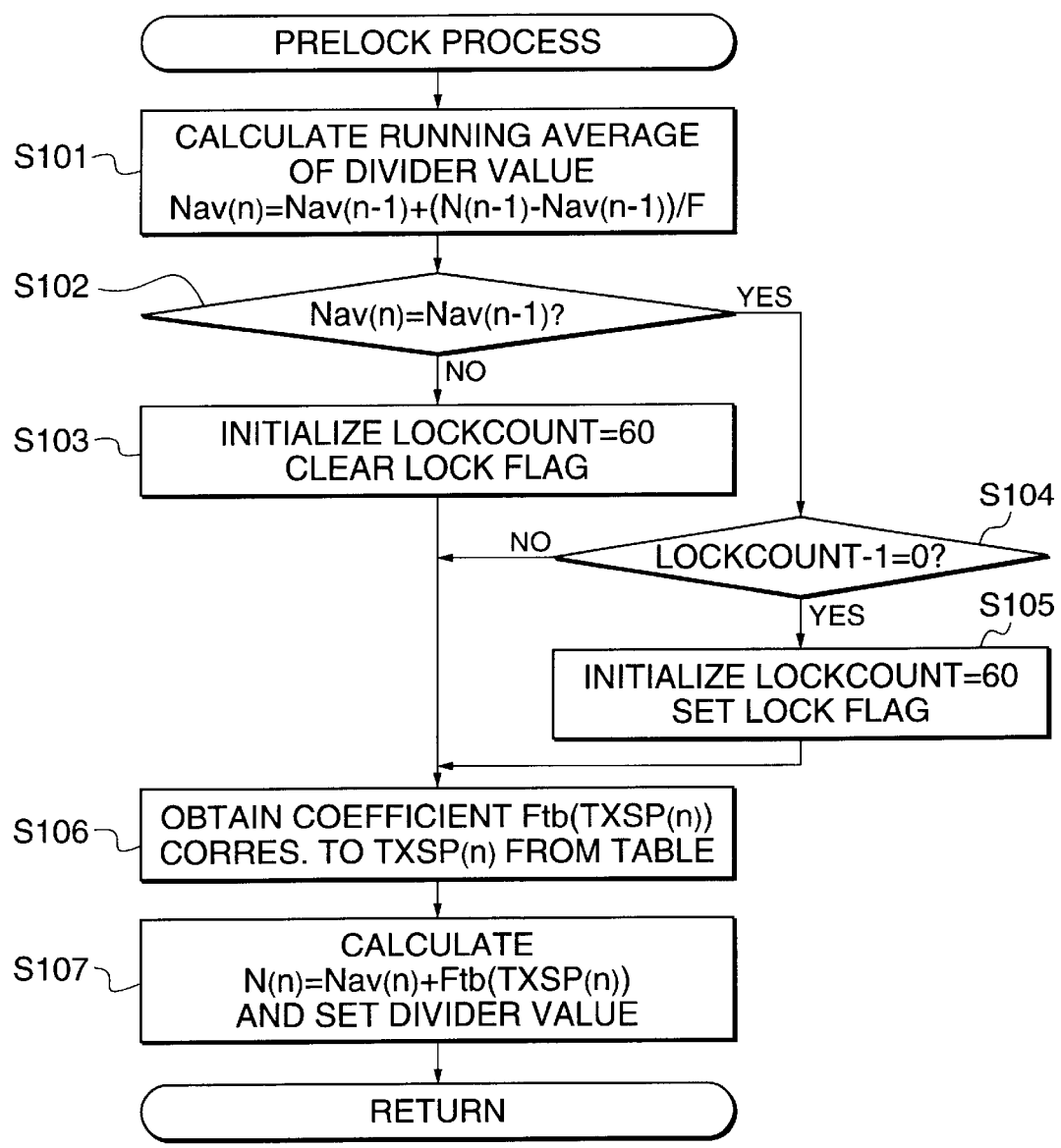
FIG. 10 is a flow chart showing in detail the operation of prelock control executed at a step S100 in FIG. 9.

As described above, in the present embodiment, the prelock control shown in FIG. 10 is provided whenever the interruption process shown in FIG. 9 is executed (whenever the SOF indicative of the start of a frame, is detected), thereby enabling the synchronization control locked to an output data flow to be provided based on the frequency of a corresponding input signal.

Further, by changing the initialization or filtering of the divider value depending on the sampling clock for input data, the output frequency can be easily changed to thereby flexibly accommodate various frequencies.

Next, the postlock control (step S200 in FIG. 9) will be explained with reference to the flow chart shown in FIG. 12.

Upon start of the postlock control, the CPU 13 first determines whether or not the free capacity TXSP(n) exceeds the unlocking threshold value (step S201). More specifically, it is determined that the free capacity TXSP(n) of the FIFO 11 exceeds the unlocking threshold value when the free capacity TXSP(n) is larger than the upper unlocking threshold value shown in FIG. 8 or is smaller than the lower unlocking threshold value shown in the same figure (the answer to the step S201 is Yes). Then, the lock flag, which is indicative of the locked state, is cleared to initialize the divider value N (step S202). The divider value N is set to an initial value depending on the sampling rate of the audio data or the frequency of the external clock ExCLK.

Then, the CPU 13 controls the 1/N divider 15 based on the divider value N, which has been returned to the initialized value (step S203), to thereby complete the postlock control. Thus, during the next interruption process (FIG. 9), the prelock control is provided to enable the locked state to be recovered again.

On the other hand, if it is determined at the step S201 that the free capacity TXSP(n) does not exceed the unlocking threshold value (the answer to the step S201 is No), then a process is started, which compares the free capacity TXSP(n) with each of the threshold values shown in FIG. 8 to determine the divider value.

As described previously, if the FIFO 11 has a large free capacity, the divider value N may be increased to reduce the frequency of the output sampling signal Fs, and if the FIFO 11 has a small free capacity, the divider value N may be reduced to increase the frequency of the output sampling signal Fs. However, in order to keep the least possible change of the frequency of the output sampling signal Fs after the locking, the divider value is allowed to increase or decrease twice or less once the upper or lower threshold value is reached. If the number of times the divider value must be changed exceeds this limit number, the divider value N is left as it is. If this action results in that the unlocking threshold value is exceeded, the prelock control is provided to stabilize the free capacity and the divider value again.

More specifically, if it is determined at the step S201 that the free capacity TXSP(n) does not exceed the unlocking threshold value (the answer to the step S201 is No), then it is first determined whether or not the free capacity TXSP(n) exceeds the second upper threshold value (step S204). If it is determined that the free capacity TXSP(n) exceeds the second upper threshold value, then it is first determined whether or not the number of times the divider value N has been increased is equal to or smaller than the limit number (step S205). In this case, flags which are each indicative of an increase in the divider value N based on the corresponding threshold value may be used to determine whether or not the number of times is equal to or smaller than the limit number. If, for example, the divider value N has been increased based on the first upper threshold value, a first upper-limit flag is set with the other flags cleared. In this flag state, it can be determined that the number of times the divider value has been increased based on the first upper threshold value exceeds the limit number but that the number of times the divider value has been increased based on the second upper threshold value is equal to or smaller than the limit number. Further, if the divider value has been increased based on the second upper threshold value, a second upper-limit flag is set with the other flags cleared. In this flag state, it can be determined that both the numbers of times the divider value has been increased based on the first and second upper threshold values exceed the limit number. If the number of times the divider value has been increased is equal to or smaller than the limit number (the answer to the step S205 is Yes), then the divider value N(n)=N(n−1)+1 is executed to increase the last divider value by 1 (step S206) to control the 1/N divider 15 (step S203).

If, however, it is determined at the step S205 that the number of times the divider value has been increased exceeds the limit number (the answer to the step S205 is No), then the divider value N can no longer be changed and the divider value N(n)=N(n−1) is thus executed (step S207) to use the last divider value to control the 1/N divider 15 (step S203).

Moreover, the calculation of the divider value N based on the determination of the limit number for the number of times the divider value N has been changed is not limited to the case where the free capacity TXSP(n) exceeds the second upper threshold value.

This determination is also made if the free capacity TXSP(n) decreases below the second lower threshold value, increases above the first upper threshold value, and decreases below the first lower threshold value.

More specifically, first, when it is determined at the step S204 that the free capacity TXSP(n) is equal to or smaller than the second upper threshold value (the answer to the step S204 is No), then it is determined whether or not it is smaller than the second lower threshold value (step S208). If it is determined that the free capacity TXSP(n) is smaller than the second lower threshold value (the answer to the step S208 is Yes), the divider value N may be reduced to increase the frequency of the output sampling signal Fs. Since, however, the number of times the divider value can be reduced is limited to two, it is first determined whether or not the number of times the divider value has been reduced is equal to or smaller than the limit number (step S209).

Here, if the number of times the divider value has been reduced is equal to or smaller than the limit number (the answer to the step S209 is Yes), then the divider value N(n)=N(n−1)−1 is executed to reduce the last divider value by 1 (step S210) to control the 1/N divider 15 (step S203).

On the other hand, if it is determined at the step S209 that the number of times the divider value has been reduced exceeds the limit number (the answer to the step S209 is No), then the divider value N can no longer be changed and the divider value N(n)=N(n−1) is thus executed (step S207) to use the last divider value to control the 1/N divider 15 (step S203).

Moreover, if the free capacity TXSP(n) of the FIFO 11 is equal to or smaller than the second upper threshold value (the answer to the step S204 is No) and is equal to or larger than the second lower threshold value (the answer to the step S208 is No), then it is determined whether or not the free capacity TXSP(n) exceeds the first upper threshold value (step S211). If the free capacity TXSP(n) exceeds the first upper threshold value (the answer to the step S211 is Yes), it must also be determined whether or not the number of times the divider value has been increased is equal to or smaller than the limit number (step S205), as in the case where the second upper threshold value is exceeded.

Further, if the free capacity TXSP(n) is equal to or smaller than the first upper threshold value (the answer to the step S211 is No), it is determined whether or not the free capacity TXSP(n) is smaller than the first lower threshold value (step S212). If the free capacity TXSP(n) is smaller than the first lower threshold value (the answer to the step S212 is Yes), it is determined whether or not the number of times the divider value has been reduced is equal to or smaller than the limit number (step S205), as in the case where the free capacity is smaller than the second lower threshold value.

If the results of the determinations at the steps S204, S208, S211, and S212 are all negative, it can be determined that the free capacity TXSP(n) of the FIFO 11 falls within the permissible range and therefore the divider value N need not be changed. Then, the numbers of times the divider value has been increased and reduced are each set to zero (step S213), and the divider value N(n)=N(n−1) is thus executed (step S207) to use the last divider value to control the 1/N divider 15 (step S203).

Figure 12:
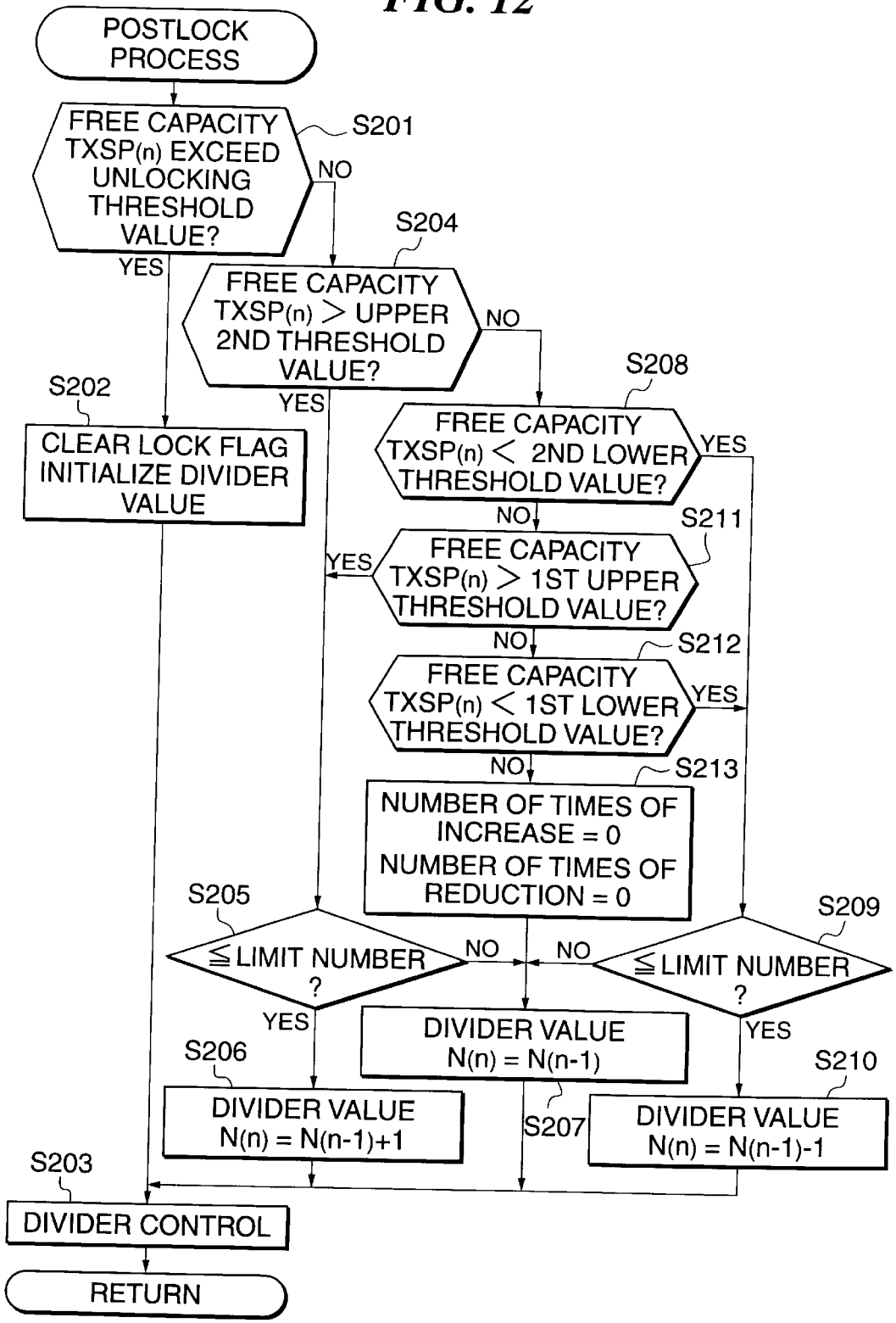
FIG. 12 is a flow chart showing in detail the operation of postlock control executed at a step S200 in FIG. 9.

After the lock flag has been set during the prelock control shown in FIG. 10, whenever the interruption process shown in FIG. 9 is executed (whenever the SOF indicative of the start of a frame), the postlock control shown in FIG. 12 is provided during the locking period such that the divider value N remains within ±1 from the divider value in the locked state, as described below referring to a specific example of the post lock control operation. This enables the frequency of the output sampling signal Fs to be stabilized to prevent the audio characteristics from being degraded.

Figure 13:
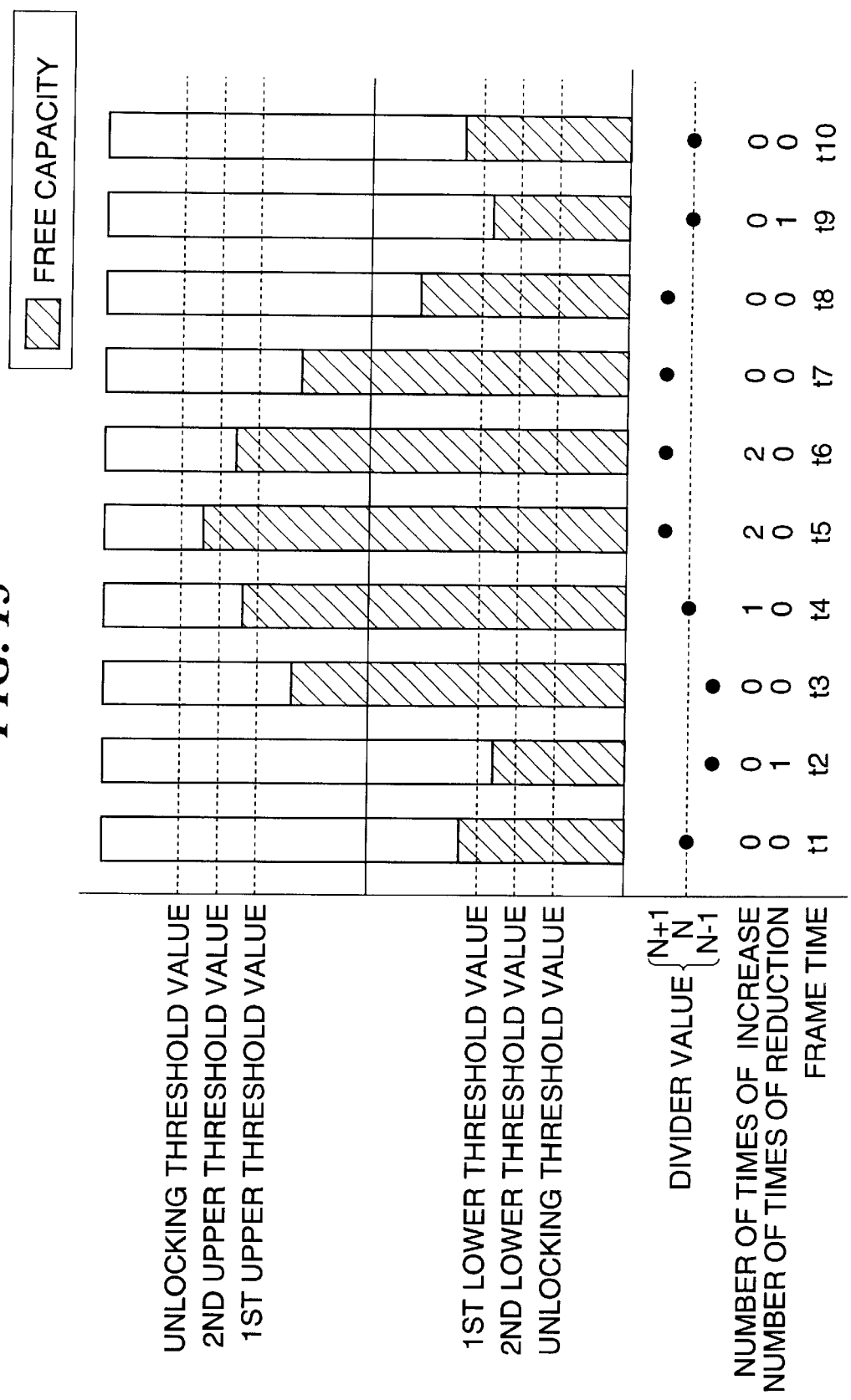
FIG. 13 is a view showing a specific example of the operation of the present embodiment.

Then, the specific example of the postlock control operation shown in FIG. 12 will be explained with reference to FIG. 13. The specific example shown in FIG. 13 indicates the state of the free capacity of the FIFO 11 during each frame time (t1 to t10) in the case where the free capacity of the FIFO 11 is close to the first lower threshold value and the locked state occurs with the divider value N. It also shows the number of times the divider value has been increased or reduced during each frame time as well as the divider value determined based on this number. In this example, it is assumed that the free capacity of the FIFO 11 increases if the divider value is N and that the divider value is N or N+1 without any factor such as noise (see FIG. 6A).

First, at the time t1, the divider value is N as in the locked state, and the number of times of increase or decrease=0 because the divider value has not been changed.

At the time t2, however, it is determined that the free capacity of the FIFO 11 decreases below the first lower threshold value due to noise or another cause (the answer to the step S212 is Yes). Since the number of times of decrease=0 before this point of time, it is determined that the number of times of decrease is equal to or smaller than the limit number (step S209) and the divider value becomes N−1 (step S210). Since the divider value has been reduced during the time t2, the FIFO 11 has an increased free capacity at the time t3. The free capacity, however, is determined to be equal to or smaller than the first upper and lower threshold values (the answer to the step S212 is No), so that the numbers of times of increase and decrease become zero (step S213) and the divider value remains at N−1 as in the time t2 (step S207).

Since the divider value thus remains at N−1, at the time t4, the free capacity further increases and is determined to exceed the first upper threshold value (the answer to the step S211 is Yes). Here, since the number of times of decrease=0 before this point of time, it is determined that the number of times of decrease is equal to or smaller than the limit number (step S205) and the divider value becomes N−1+1 (step S206). Thus, the divider value becomes N as in the locked state, but the free capacity of the FIFO 11 is not decreased. At the time t5, the free capacity further increases and is determined to exceed the second upper threshold value (the answer to the step S204 is Yes). Since the number of times the divider value has been increased is one before this point of time, it is determined that the number of times of increase is equal to or smaller than the limit number (the answer to the step S205 is Yes) and the divider value becomes N+1 (step S206).

At this point of time, the divider value exceeds the value in the locked state, and the free capacity of the FIFO 11 starts to decrease. Then, at the time t6, the free capacity of the FIFO 11 is smaller than the second upper threshold value. Here, it is determined that the free capacity exceeds the first upper threshold value (the answer to the step S211 is Yes), but since the number of times the divider value has been increased is already equal to the limit number (two) (the answer to the step S205 is No), the divider value remains at N+1 (step S207).

Since the divider value is still larger than the one in the locked state, the free capacity of the FIFO 11 further decreases and it is determined at the time t7 that the free capacity is larger than the first lower threshold value and smaller than the first upper threshold value (the answer to the step S212 is No). Consequently, the numbers of times the divider value has been increased and reduced return to zero (step S213), but the divider value remains at N+1 (step S207).

Similarly, at the time t8 as well, the free capacity of the FIFO 11 decreases because the divider value remains at N+1, but the divider value is not changed because the free capacity is larger than the first lower threshold value and smaller than the first upper threshold value.

The free capacity of the FIFO 11, however, continues to decrease, and it is determined at the time t9 that the capacity has decreased below the first lower threshold value (the answer to the step S212 is Yes). Since the number of times the divider value has been reduced is zero before this point of time, the divider value becomes N+1−1=N (step S210), which is the divider value in the locked state. As described above, the divider value having N serves to increase the free capacity of the FIFO 11, so that at the time t10, the free capacity is larger than the first lower threshold value, with the divider value set equal to the value in the locked state. This means that the operation has been returned to its normal state.

As described above, in the present embodiment, the number of times the divider value is increased or reduced is limited by setting the upper or lower threshold value for the free capacity of the FIFO 11, thus preventing the frequency of the output sampling signal Fs from being frequently changed.

Further, since the two-level upper threshold values and the two-level lower threshold values are set, even if the divider value is locked in an unstable state where the free capacity of the FIFO 11 is close to the threshold value, an inappropriate increase or decrease in the divider value caused by noise or fluctuation can be prevented.

The present invention is not limited to the above described embodiment, but various variations are possible as described below.

In the above described embodiment, the data are transferred using the USB, and the signal (SOF) which is indicative of the start of a frame is thus used as a timing signal input in accordance with a predetermined cycle. The data transfer, however, need not necessarily be executed using the USB, and the type of the timing signal is not limited. Further, the audio data, constituting an isochronous data stream, are used as the externally input data, but the type of data is not particularly limited insofar as they are periodically input.

In the above described embodiment, the output frequency is controlled by the 1/N divider 15 by dividing the frequency of the clock generated by the external fixed oscillator 16 and changing the divider value. Other means, however, may be used to control the output frequency, and in such a case, the CPU 13 may determine the output frequency itself instead of the divider value. Further, the method for calculating the average of the output frequency each time the timing signal is input in accordance with the predetermined cycle is not limited to the one illustrated in the above described embodiment, but other calculation methods may be employed.

Further, the coefficient used to maintain the output frequency at a fixed value as determined depending on the free capacity of the FIFO 11 at the time of inputting of the timing signal is not limited to the tables illustrated in the above described embodiment, but other means may be employed.

In the above described embodiment, the lock state occurs if the calculated average frequency remains at a fixed value for a time period corresponding to 60 frames, but this predetermined time period is only illustrative and other values may be employed.

Moreover, after the locking, a value of 1 is added to or subtracted from the divider value when the upper or lower threshold value is reached, but the predetermined value is not necessarily limited to the value of 1 and other values may be employed insofar as the resulting variation of the output frequency does not degrade the audio characteristics.

What is claimed is:

1. A synchronization control apparatus comprising:

a storage device that has a predetermined capacity for storing externally input data;

a first frequency controlling device formed to conduct output frequency control of a first frequency at which data stored in said storage device is outputted, based on an average frequency generated from an average of said first output frequency and of a coefficient for setting said average frequency at a fixed value, and wherein said first frequency controlling device is further formed to calculate said average frequency of said first output frequency whenever a timing signal is inputted in accordance with a predetermined cycle and to determine said coefficient depending on a free capacity of said storage device at a time of inputting said timing signal; and a second frequency control device formed to operate if said average frequency continuously exhibits a fixed value for a predetermined time period so as to decrease said output frequency when a free capacity of said storage device is larger than a predetermined upper threshold value, or to increase said output frequency when the free capacity of said storage device is smaller than a predetermined lower threshold value, wherein said upper threshold value and said lower threshold value each comprise two different values.

2. A synchronization control apparatus according to claim 1, further comprising:

a signal generating device that generates a signal of a predetermined frequency, and a frequency dividing device that divides said predetermined frequency using a frequency dividing value, wherein said first frequency control device and said second frequency control device change said frequency dividing value to control said output frequency.

3. A synchronization control apparatus according to claim 2, wherein said second frequency control device decreases said output frequency by adding a predetermined value to said frequency dividing value, and wherein said second frequency control device increases said output frequency by subtracting said predetermined value from said frequency dividing value.

4. A synchronization control apparatus according to claim 1, wherein said second frequency control device increases or decreases said output frequency a number of times equal to or smaller than a predetermined limit number depending on said upper threshold value and said lower threshold value.

5. A synchronization control method comprising:

a step of storing externally input data in a storage device that has a predetermined data storage capacity;

a step of controlling a first output frequency at which data stored in said storage device is outputted, by calculating, based on an average frequency an average of said first output frequency and of a coefficient for setting said average frequency at a fixed value, whenever a timing signal is inputted in accordance to a predetermined cycle, and by determining said coefficient depending on a free capacity of said storage device at time of inputting of said timing signal, and a second frequency control step of decreasing said output frequency, if said calculated average frequency continuously exhibits a fixed value for a predetermined period, when said free capacity of said storage device is larger than a predetermined upper threshold value, while increasing said output frequency when said free capacity of said storage device is smaller than a predetermined lower threshold value, wherein said upper threshold value and lower threshold value each comprise two different values.

* * * * *